(12) United States Patent
Lammers et al.

(10) Patent No.: US 6,781,896 B2
(45) Date of Patent: Aug. 24, 2004

(54) MRAM SEMICONDUCTOR MEMORY CONFIGURATION WITH REDUNDANT CELL ARRAYS

(75) Inventors: Stefan Lammers, South Burlington, VT (US); Dietmar Gogl, Essex Junction, VT (US); Gerhard Müller, Meitingen (DE)

(73) Assignee: Infineon Technologies AG, Munich (DE)

( * ) Notice: Subject to any disclaimer, the term of this patent is extended or adjusted under 35 U.S.C. 154(b) by 69 days.

(21) Appl. No.: 10/135,416

(22) Filed: Apr. 30, 2002

(65) Prior Publication Data

US 2002/0159317 A1 Oct. 31, 2002

(30) Foreign Application Priority Data

Apr. 30, 2001 (DE) .......................................... 101 21 182

(51) Int. Cl.⁷ ................................................. G11C 7/00
(52) U.S. Cl. .................... 365/200; 365/158; 365/230.03
(58) Field of Search ................................ 365/200, 158, 365/230.03

(56) References Cited

U.S. PATENT DOCUMENTS

| | | | | |
|---|---|---|---|---|
| 5,257,229 A | * | 10/1993 | McClure et al. | 365/200 |
| 5,359,560 A | * | 10/1994 | Suh et al. | 365/200 |
| 5,381,370 A | * | 1/1995 | Lacey et al. | 365/200 |
| 6,154,413 A | | 11/2000 | Longwell et al. | |
| 6,351,408 B1 | * | 2/2002 | Schwarzl et al. | 365/158 |
| 6,400,602 B2 | * | 6/2002 | Takata et al. | 365/185.09 |

FOREIGN PATENT DOCUMENTS

DE          197 44 095 A1     4/1999

* cited by examiner

*Primary Examiner*—Hoai Ho
(74) *Attorney, Agent, or Firm*—Laurence A. Greenberg; Werner H. Stemer; Ralph E. Locher

(57) ABSTRACT

The MRAM semiconductor memory configuration has MRAM main cell arrays in the form of a crosspoint array or a transistor array together with redundant MRAM cell arrays formed of redundant MRAM memory cells arranged in a plurality of planes and provided on the same chip. The redundant MRAM cell arrays are distributed over the individual planes of the memory matrix or one plane of the memory array is used in its entirety for providing redundant cell arrays.

16 Claims, 2 Drawing Sheets

MRAM SEMICONDUCTOR MEMORY CONFIGURATION WITH REDUNDANT CELL ARRAYS

BACKGROUND OF THE INVENTION

Field of the Invention

The invention lies in the semiconductor technology field. More specifically, the invention relates to an MRAM semiconductor memory configuration wherein a plurality of planes with MRAM main cell arrays in the form of a crosspoint array or transistor array together with redundant MRAM cell arrays comprising redundant MRAM memory cells are provided on the same chip.

In magnetoresistive memories (MRAMs), the memory effect resides in the magnetically variable electrical resistance of the memory cell. FIG. 1 shows an individual MRAM memory cell having, at the crossover between two conductors, a word line WL and a bit line BL, which are generally arranged orthogonally with respect to one another. Stacked one above the other are a hard-magnetic layer ML (fixed), a tunnel oxide TL and a soft-magnetic layer ML (free), which together form an MTJ memory cell (MTJ= Magnetic Tunnel Junction). Information is stored by rotating the magnetization direction of the soft-magnetic layer ML (free) relative to that of the hard-magnetic layer ML (fixed). The requisite magnetic fields are generated by currents $I_{WL}$, $I_{BL}$ respectively through the word line WL and the bit line BL, which are superposed at the crossover point. If the magnetization direction of both magnetic layers is identical, the multilayer system comprising ML (fixed), TL and ML (free) has a low resistance $R_c$. If the magnetization direction is not identical, a high resistance $R_c$ is produced. This change in resistance is utilized for information storage in digital memory applications.

Extremely high storage density can be achieved by a plurality of metalization systems with intervening planes comprising MTJs being stacked one above the other.

FIGS. 2A and 2B show a magnetoresistive semiconductor memory configuration in a crosspoint array structure which makes it possible to produce a high-density semiconductor memory configuration. An MRAM crosspoint array of this type achieves an extremely high packing density by stacking the individual memory arrays one above the other.

FIG. 3 shows an MRAM semiconductor memory configuration which differs from the crosspoint array structure of FIGS. 2A and 2B. This MRAM transistor array is distinguished by a selection transistor T which is assigned to each MRAM memory cell and which can be used to select individual MRAM memory cells for writing and reading. The gates of mutually assigned selection transistors T, for example of a row, are interconnected by a selection line AL, while the drain paths of the selection transistors T of a column are interconnected by a programming line PL.

If memories having a high storage capacity are realized, then the integration of redundant memory elements on the chip is of significant importance in order to ensure a sufficiently high yield during chip fabrication. In this case, when the memory is tested, defective memory cells are replaced by the additionally available redundant memory cells.

Commonly assigned U.S. Pat. No. 6,351,408 (German patent application DE 197 44 095 A) describes an MRAM memory cell arrangement wherein the memory elements are arranged one above the other in at least two layers. In this case, the bit lines are provided separately in each case for memory elements S1 and S2 and the word line is provided jointly for both memory elements. This arrangement of MRAM memory cells stacked one above the other has the effect that the area requirement per memory element decreases and the packing density can be increased. At no point, however, does this document describe an MRAM semiconductor memory configuration wherein a plurality of planes with MRAM main cell arrays in the form of a crosspoint array or transistor array together with redundant MRAM cell arrays comprising redundant MRAM memory cells are provided on the same chip. This is because, as mentioned above, an MRAM main cell array in each case comprises memory cells and the associated bit, word and, if appropriate, selection lines, which are thus provided separately for each MRAM main cell array.

U.S. Pat. No. 6,154,413 describes a memory architecture, also for an MRAM semiconductor memory wherein a plurality of so-called "memory tiles" are arranged in an integrated circuit chip. The memory tiles could also be considered as memory subarrays. These memory tiles are integrated next to one another in the same plane. In order to increase the reliability, this document proposes that each memory subarray is assigned its own redundant memory rows and/or columns and a corresponding redundancy control circuit arrangement. In this case, the redundant memory cell columns and rows are each fixedly assigned to a main memory cell array of a memory tile.

U.S. Pat. No. 5,381,370 proposes that a main memory cell array is fixedly assigned a redundant cell array in such a way that it is possible to address the main memory cell array and the redundant memory cell array with the same column address.

SUMMARY OF THE INVENTION

It is accordingly an object of the invention to provide an MRAM semiconductor memory configuration with redundant cell fields, which overcomes the above-mentioned disadvantages of the heretofore-known devices and methods of this general type and which provides for advantageous structural concepts for redundancy to be provided in MRAM semiconductor memory configurations.

With the foregoing and other objects in view there is provided, in accordance with the invention, an MRAM semiconductor memory configuration, comprising:

a memory matrix of a plurality of MRAM main cell arrays arranged in a crosspoint array or a transistor array and a plurality of redundant MRAM cell arrays formed with redundant MRAM memory cells, the plurality of MRAM main cell arrays together with the plurality of redundant MRAM cell arrays being disposed in a plurality of planes commonly integrated in a given chip; and wherein the redundant MRAM cell arrays are distributed over individual the planes of the memory matrix such that defective memory cells in one plane can be replaced with redundant memory cells from other planes.

In the case of the crosspoint array structure of an MRAM semiconductor memory configuration, in accordance with one aspect of the invention, the redundant cell arrays can be distributed over the individual planes of the memory matrix. In other words, a defective MRAM memory cell need not necessarily be replaced by redundant memory cells in the same plane, but rather can be replaced by means of redundant cell arrays from other planes of the memory matrix. This affords the advantage of smaller cell arrays per plane in order to achieve a comparable yield. This leads to a saving of chip area.

With the above and other objects in view there is also provided, in accordance with the invention, an MRAM semiconductor memory configuration having a memory matrix of a plurality of MRAM main cell arrays arranged in a crosspoint array or a transistor array and a plurality of redundant MRAM cell arrays formed with redundant MRAM memory cells, the plurality of MRAM main cell arrays together with the plurality of redundant MRAM cell arrays being disposed in a plurality of planes commonly integrated in a given chip, and an improvement according to which one of the planes of the MRAM semiconductor memory configuration is used in its entirety for redundant cell arrays.

That is, in accordance with a second aspect of the invention, the MRAM semiconductor memory configuration arranged in a crosspoint array structure can have a complete redundant plane wherein redundant cell arrays are provided.

In order to be able to replace the defective memory cells, the addresses of the defective word and bit lines must be stored in a nonvolatile manner. This can be done by means of electrical fuses. In the case of a crosspoint array structure of an MRAM semiconductor memory configuration, the area below the cell array can be utilized for circuits for storing the addresses of the defective lines, i.e. word lines and bit lines.

In an advantageous refinement, the addresses of the defective word and bit lines can be stored in special MTJ-E fuses. These E fuses are, in principle, normal MRAM memory cells and can be brought to electrical breakdown with an increased voltage. MTJ-E fuses of this type can be realized by means of a dedicated MTJ layer above the memory array.

Redundant bit lines BL are more important than redundant word lines in crosspoint arrays since, owing to the complex read method, parasitic currents through defective memory cells on the bit lines have a significantly more harmful effect on the sense amplifier than on the driver circuit on the word line. Therefore, the invention proposes providing a larger number of redundant bit lines than word lines.

It is advantageous that, in the case of an MRAM memory configuration according to the invention in a crosspoint array structure, for the case of defective cells, which then have excessively low resistances, the word lines and/or bit lines are connected up in a high-impedance manner in order to suppress disturbing influences. In the case of an MRAM semiconductor memory configuration which is arranged in a transistor array structure in accordance with FIG. 3, it is possible, moreover, to deactivate defective memory cells by switching off the gates of the selection transistors on the corresponding word line WL by means of the selection line which connects the gates of the selection transistors T. In the case of short circuits between bit lines BL and programming lines on account of cell defects, it is possible to employ the principle of connecting up in a high-impedance manner, already mentioned for the case of a crosspoint array structure.

It is also the case with an MRAM semiconductor memory configuration organized in a transistor array structure in accordance with FIG. 3 that the addresses of the defective word and bit lines can be stored in MTJE fuses. These MTJE fuses can also be arranged directly above the MRAM transistor array.

Other features which are considered as characteristic for the invention are set forth in the appended claims.

Although the invention is illustrated and described herein as embodied in a mram semiconductor memory configuration with redundant cell arrays, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
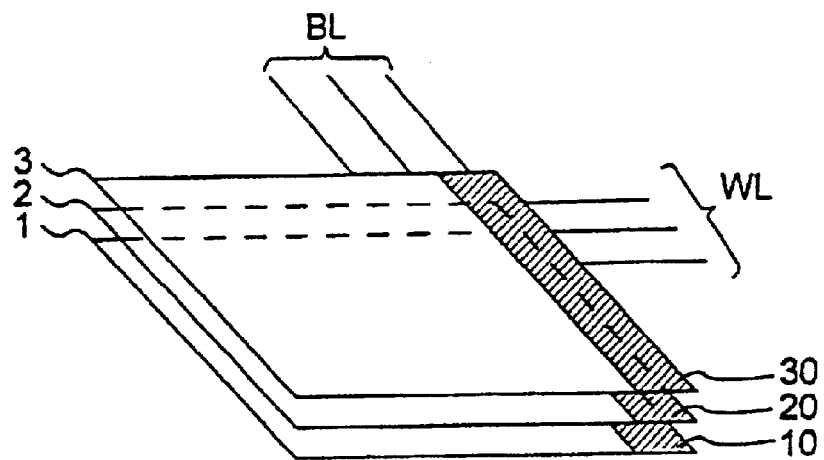
FIG. 4 is a perspective diagram of a first exemplary embodiment of redundancy of an MRAM semiconductor memory configuration wherein redundant cell arrays are distributed over individual planes, lying one above the other, of MRAM main cell arrays.

Referring now once more to the figures of the drawing in detail and continuing, particularly, with FIG. 4 thereof, there is shown, diagrammatically and in perspective, a first exemplary embodiment of redundant MRAM cell arrays provided in an MRAM semiconductor memory configuration. In accordance with FIG. 4, MRAM main cell arrays are arranged one above the other in three planes 1, 2 and 3, for example. Word lines WL and bit lines BL lead to the cell arrays of the individual planes. Redundant cell arrays 10, 20, 30 are distributed over the individual planes 1, 2, 3 of the memory matrix, in other words a defective memory cell need not necessarily be replaced by redundant memory cells of the same plane, but rather can be replaced by redundant memory cells from other planes of the memory matrix. By way of example, a defective memory cell in the plane 1 can be replaced by a redundant memory cell in the plane 3, i.e. in the redundant MRAM memory cell array 30. This structure results in smaller cell arrays per plane in order to achieve comparable yields. This leads to a saving of chip area.

Figure 5:
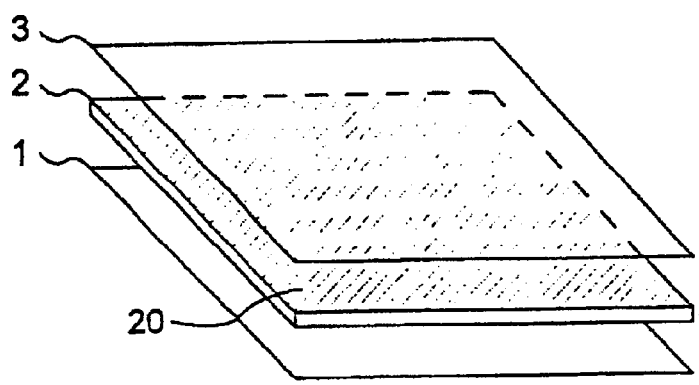
FIG. 5 is a perspective diagram of a second exemplary embodiment of the invention, wherein provision is made of a complete plane for providing redundant cell arrays.

FIG. 5 illustrates a second exemplary embodiment of an MRAM semiconductor memory configuration provided with redundancy. In this case, a complete plane 2 of the memory array is available for redundant cell arrays 20.

Figure 6:
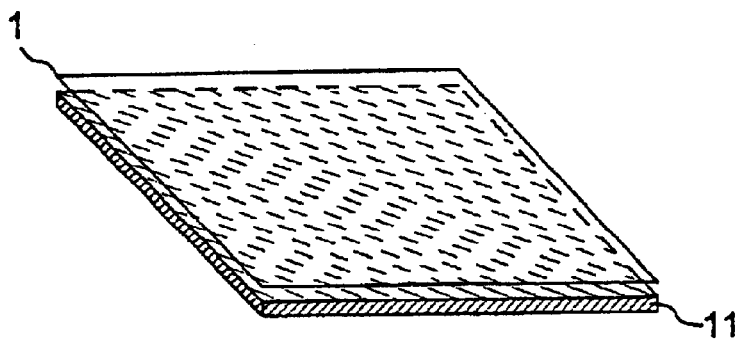
FIG. 6 is a perspective diagram of an exemplary embodiment of an MRAM semiconductor memory configuration wherein circuits for storing addresses of defective lines are arranged below the cell array.

In order to be able to replace the defective memory cells, the addresses of the defective word and bit lines must be stored in a nonvolatile manner. This can be done by means of electrical fuses. In the case of an MRAM crosspoint array, FIG. 6 shows a structure according to the invention wherein a plane 11 below a cell array which is located in a plane 1, for example, is utilized for circuits for storing the addresses of the defective lines, i.e. word lines and bit lines.

Figure 7:
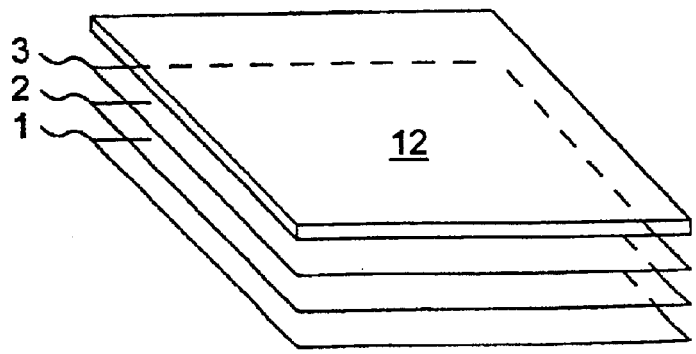
FIG. 7 is a perspective diagram of a further embodiment of an MRAM semiconductor memory configuration, wherein MTJE fuses for storing the addresses of defective word and bit lines are arranged in a plane above the memory array.

Finally, FIG. 7 shows a further embodiment according to the invention of an MRAM semiconductor memory configuration provided with redundancy, wherein a dedicated MTJ layer 12 is available above the memory arrays, i.e. above the main cell arrays located in planes 1, 2, 3 stacked one above the other, in order to store the addresses of defective word and bit lines there preferably in MTJ-E fuses.

It holds true altogether for the exemplary embodiments of an MRAM semiconductor memory configuration which are shown in FIGS. 4 to 7 that redundant bit lines BL are more important than redundant word lines in crosspoint arrays. This has the result that, according to the invention, a larger number of redundant bit lines than word lines are provided. Owing to the complex read method, parasitic currents through defective MTJ memory cells on the bit lines BL have a significantly more harmful effect on a sense amplifier than on the driver circuit on the word line.

Moreover, it is an advantageous measure, in the case of an MRAM semiconductor memory configuration arranged in a crosspoint array structure, for the case of defective cells, which have excessively low resistances, for the word lines and/or bit lines to be connected up in a high-impedance manner in order to suppress disturbing influences.

Figure 1:
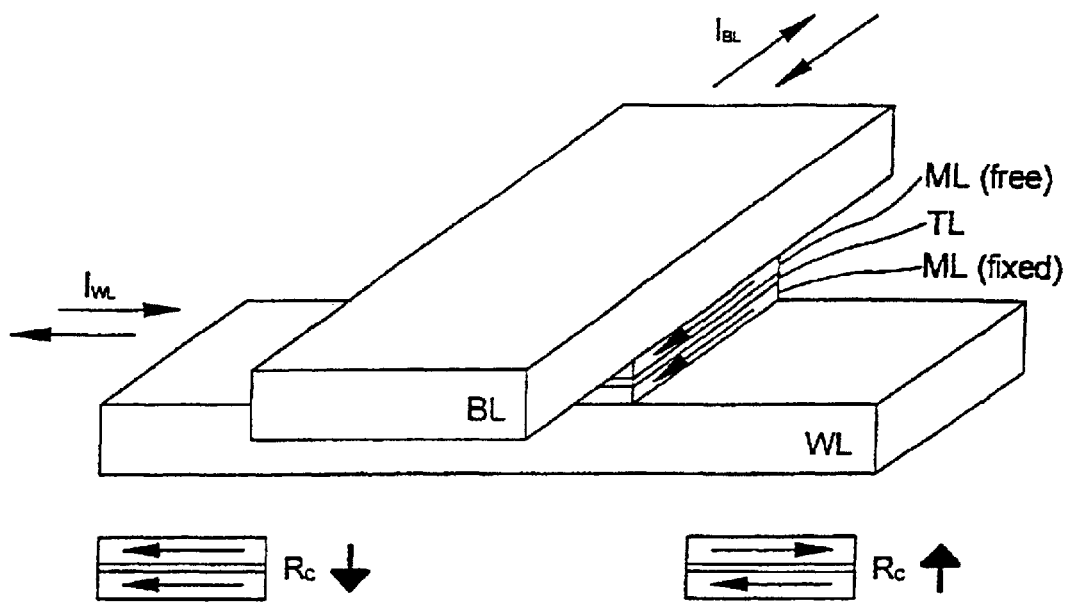
FIG. 1 is a diagrammatic perspective view of an MTJ memory cell arranged at the crossover point between a bit line and a word line.
Figure 2A:
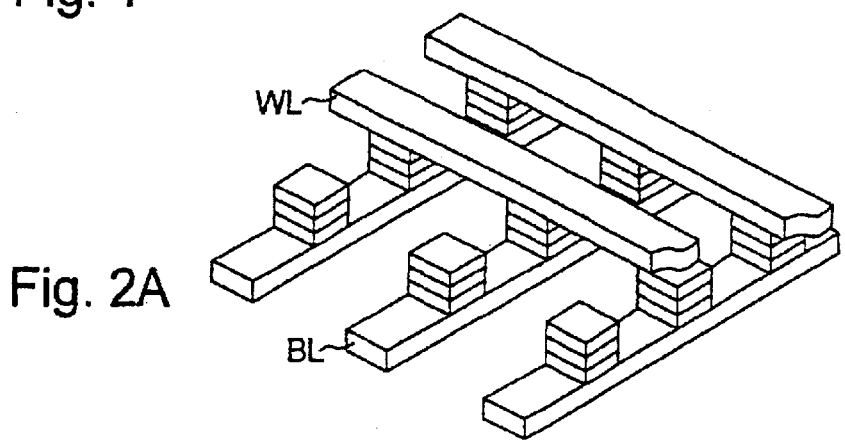
FIG. 2A is a diagrammatic and perspective view of an MRAM semiconductor configuration in a crosspoint array structure.
Figure 2B:
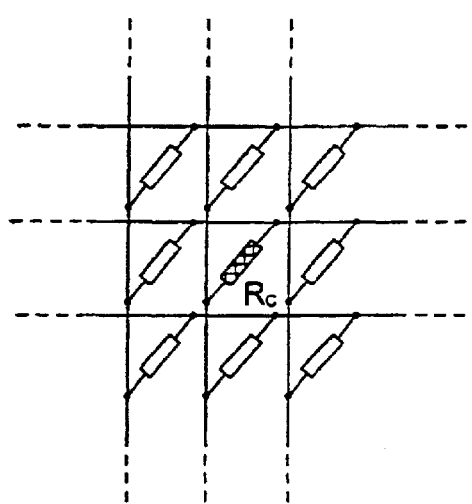
FIG. 2B is an equivalent circuit diagram of the crosspoint array structure in accordance with FIG. 2A.
Figure 3:
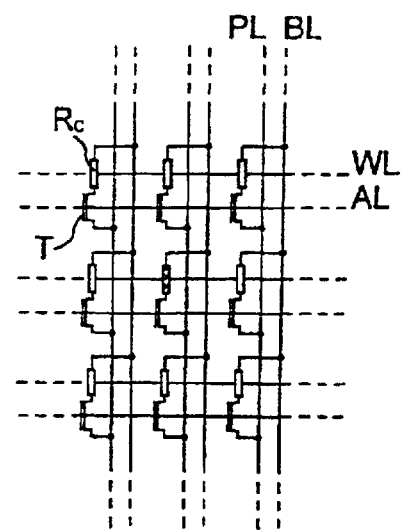
FIG. 3 is a schematic of an MRAM semiconductor memory configuration in a transistor array structure.

In the case of an MRAM transistor array structure (FIG. 3), defective memory cells can be deactivated by switching off the gates of the selection transistors T of the corresponding word line WL. This is done by means of a corresponding signal on the selection line AL which connects the gates. If short circuits occur between bit lines BL and programming line PL on account of cell defects it is also possible to again employ the principle of connecting up in a high-impedance manner, as in the case of the crosspoint array structure of an MRAM semi conductor memory configuration.

In the same way as was explained for a crosspoint array structure with reference to FIGS. 6 and 7, in the case of an MRAM semiconductor memory configuration arranged in a transistor array structure (FIG. 3), the addresses of defective word and bit lines are stored in a nonvolatile manner. This can likewise be done in MTJE fuses 12 which, for example, as in FIG. 7, are arranged in one plane directly above the MRAM transistor array 1, 2, 3.

We claim:

1. An MRAM semiconductor memory configuration, comprising:
   a memory matrix of a plurality of MRAM main cell arrays arranged in a crosspoint array or a transistor array and a plurality of redundant MRAM cell arrays formed with redundant MRAM memory cells, said plurality of MRAM main cell arrays together with said plurality of redundant MRAM cell arrays being stacked in a plurality of planes commonly integrated in a given chip;
   said redundant MRAM cell arrays being distributed over each of said planes of said memory matrix such that defective memory cells in a given one of said planes can be replaced with redundant memory cell from any other one of said planes.

2. The MRAM semiconductor memory configuration according to claim 1, wherein an area below each main cell array contains circuits for storing addresses of defective word and bit lines of the crosspoint array or the transistor array.

3. The MRAM semiconductor memory configuration according to claim 2, wherein said circuits for storing the addresses of the defective lines have electrical fuses.

4. The MRAM semiconductor memory configuration according to claim 1, which comprises a magnetic tunnel junction layer above said memory array, said layer containing MTJ-E fuses for storing addresses of defective word and bit lines.

5. The MRAM semiconductor memory configuration according to claim 1, wherein said redundant MRAM call arrays have a larger number of redundant bit lines than word lines.

6. The MRAM semiconductor memory configuration according to claim 1, wherein:
   each of said MRAM main cell arrays have word lines and bit lines;
   said MRAM main cell arrays are arranged in a crosspoint array; and
   when defective memory cells exhibit low resistance, at least one of the word lines and the bit lines are connected in a high-impedance manner.

7. The MRAM semiconductor memory configuration according to claim 1, wherein the MRAM main cell arrays are arranged in a transistor array having selection transistors with gates, and wherein switching devices are provided for deactivating defective MRAM memory cells by switching off the gates of the selection transistor on a corresponding word line.

8. The MRAM semiconductor memory configuration according to claim 7, wherein each of said MRAM transistor arrays has bit lines and programing lines connected in a high-impedance manner.

9. In an MRAM semiconductor memory configuration having a memory matrix of a plurality of MRAM main cell arrays arranged in a crosspoint array or a transistor array and a plurality of redundant MRAM cell arrays formed with redundant MRAM memory cells, said plurality of MRAM main cell arrays together with said plurality of redundant MRAM cell arrays being stacked in a plurality of planes commonly integrated in a given chip, the improvement which comprises: one of said plurality of planes of the MRAM semiconductor memory configuration is used in an entirety thereof for providing redundant cell arrays.

10. The MRAM semiconductor memory configuration according to claim 9, wherein an area below each main cell array contains circuits for storing addresses of defective word and bit lines of the crosspoint array or the transistor array.

11. The MRAM semiconductor memory configuration according to claim 10, wherein said circuits for storing the addresses of the defective lines have electrical fuses.

12. The MRAM semiconductor memory configuration according to claim 9, which comprises a magnetic tunnel junction layer above said memory array, said layer containing MTJ-E fuses for storing addresses of defective word and bit lines.

13. The MRAM semiconductor memory configuration according to claim 9, wherein said redundant MRAM cell arrays have a larger number of redundant bit lines than word lines.

14. The MRAM semiconductor memory configuration according to claim 9, wherein:
   each of said plurality of MRAM cell arrays has word lines and bit lines; and
   at least one of the word line and the bit lines are connected up in a high-impedance manner.

15. The MRAM semiconductor memory configuration according to claim 9, wherein the MRAM main cell arrays are arranged in a transistor array having selection transistors with gates, and wherein switching devices are provided for deactivating defective MRAM memory cells by switching off the gates of the selection transistor on a corresponding word line.

16. The MRAM semiconductor memory configuration according to claim 15, wherein said MRAM transistor array has bit lines and programming lines connected in a high-impedance manner.

* * * * *